(12) United States Patent
Delgado et al.

(10) Patent No.: US 10,840,055 B2
(45) Date of Patent: Nov. 17, 2020

(54) SYSTEM AND METHOD FOR PHOTOCATHODE ILLUMINATION INSPECTION

(71) Applicant: KLA-Tencor Corporation, Milpitas, CA (US)

(72) Inventors: Gildardo Delgado, Livermore, CA (US); Katerina Ioakeimidi, Sunnyvale, CA (US); Frances A. Hill, Sunnyvale, CA (US); Rudy F. Garcia, Union City, CA (US); Mike Romero, San Jose, CA (US); Zefram Marks, Gilroy, CA (US); Gary V. Lopez Lopez, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/249,069

(22) Filed: Jan. 16, 2019

(65) Prior Publication Data

US 2019/0295804 A1 Sep. 26, 2019

Related U.S. Application Data

(60) Provisional application No. 62/645,415, filed on Mar. 20, 2018.

(51) Int. Cl.
*H01J 37/073* (2006.01)
*H01J 37/285* (2006.01)
*H01J 37/244* (2006.01)
*H01J 37/29* (2006.01)

(52) U.S. Cl.
CPC .......... *H01J 37/073* (2013.01); *H01J 37/244* (2013.01); *H01J 37/285* (2013.01); *H01J 37/29* (2013.01); *H01J 2237/06333* (2013.01)

(58) Field of Classification Search
CPC ...... H01J 37/073; H01J 37/244; H01J 37/285; H01J 37/29; H01J 2237/0633; H01J 40/00; H01J 40/06; H01J 40/16
See application file for complete search history.

(56) References Cited

U.S. PATENT DOCUMENTS

| 4,460,831 A | * | 7/1984 | Oettinger | ............... B82Y 10/00 250/492.2 |
|---|---|---|---|---|
| 5,684,360 A | | 11/1997 | Baum et al. | |
| 5,898,269 A | * | 4/1999 | Baum | ................. G03F 7/70375 313/530 |

(Continued)

OTHER PUBLICATIONS

Liu et al, CsBr PhotoCathode at 257nm: A Rugged High Current Density Electron Source, SLAC-PUB-12108, 2006 (Year: 2006).*

(Continued)

*Primary Examiner* — David E Smith
(74) *Attorney, Agent, or Firm* — Suiter Swantz pc llo

(57) ABSTRACT

A high-brightness electron beam source is disclosed. The electron beam source may include a broadband illumination source configured to generate broadband illumination. A tunable spectral filter may be configured to filter the broadband illumination to provide filtered illumination having an excitation spectrum. The electron beam source may further include a photocathode configured to emit one or more electron beams in response to the filtered illumination, wherein emission from the photocathode is adjustable based on the excitation spectrum of the filtered illumination from the tunable spectral filter.

33 Claims, 8 Drawing Sheets

(56) References Cited

U.S. PATENT DOCUMENTS

| | | | | |
|---|---|---|---|---|
| 5,898,296 A | * | 4/1999 | Maddox | G05F 1/56 318/629 |
| 6,828,574 B1 | * | 12/2004 | Allen | B82Y 10/00 250/492.22 |
| 7,015,467 B2 | | 3/2006 | Maldonado et al. | |
| 10,381,187 B1 | * | 8/2019 | Moody | H01J 3/021 |
| 2004/0140432 A1 | * | 7/2004 | Maldonado | H01J 37/073 250/423 P |
| 2005/0274911 A1 | * | 12/2005 | Aloni | G03F 7/70275 250/492.22 |
| 2006/0245042 A1 | * | 11/2006 | Budni | G02F 1/395 359/330 |
| 2008/0169436 A1 | * | 7/2008 | Carroll | B82Y 40/00 250/492.22 |
| 2011/0031414 A1 | * | 2/2011 | Lippert | G02B 21/16 250/459.1 |
| 2013/0200262 A1 | * | 8/2013 | Kruit | H01J 37/226 250/307 |
| 2013/0341527 A1 | * | 12/2013 | Berney | H01J 37/073 250/396 R |
| 2014/0037052 A1 | * | 2/2014 | Adler | G01N 23/04 378/43 |
| 2014/0079188 A1 | | 3/2014 | Hesselink et al. | |
| 2014/0265828 A1 | * | 9/2014 | Maldonado | H01J 40/14 315/11.5 |

OTHER PUBLICATIONS

International Search Report dated Jul. 4, 2019 for PCT/US2019/022832.

* cited by examiner

SYSTEM AND METHOD FOR PHOTOCATHODE ILLUMINATION INSPECTION

CROSS-REFERENCE TO RELATED APPLICATION

The present application claims the benefit under 35 U.S.C. § 119(e) of U.S. Provisional Application Ser. No. 62/645,415, filed Mar. 20, 2018, entitled ADVANTAGES OF BROADBAND AND TUNABLE LIGHT SOURCES FOR PHOTOCATHODE ILLUMINATION IN INSPECTION APPLICATIONS, which is incorporated herein by reference in the entirety.

TECHNICAL FIELD

The present invention generally relates to photocathode inspection systems and, more particularly, to tunable broadband illumination sources for photocathode inspection systems.

BACKGROUND

Electron beam sources generally offer higher resolution than optical illumination sources for imaging and inspection systems. However, the data acquisition rate of scanning electron beam inspection systems may be dependent upon the electron beam source brightness. Furthermore, current electron beam inspection systems may be limited by extremely low throughput. For example, current electron beam inspection systems may take more than a month to completely inspect a mask, and much longer to completely inspect a 300 mm wafer.

In order to improve throughput, photocathodes have been utilized in multi-electron beam inspection systems used in wafer and reticle inspection applications. However, the utility of photocathodes in inspection systems has been limited due to the fact that photocathode development has been largely driven by the availability of suitable laser sources. The materials to be used in photocathode inspection systems have previously been selected based upon their compatibility with wavelengths which may be generated by currently available laser sources. Accordingly, photocathode materials have been selected based upon their compatibility with available laser sources rather than for their inspection performance capabilities. Currently, there are few laser sources which are able to provide illumination at shorter wavelengths. Additionally, those light sources which are available and able to be used in photocathode inspection systems suffer from limited power, scalability, and stability.

Therefore, it would be desirable to provide a system and method that cure one or more of the shortfalls of the previous approaches identified above.

SUMMARY

A high-brightness electron beam source is disclosed, in accordance with one or more embodiments of the present disclosure. In one embodiment, the high-brightness electron beam source includes a broadband illumination source configured to generate broadband illumination. In another embodiment, the high-brightness electron beam source includes a tunable spectral filter configured to filter the broadband illumination to provide filtered illumination having an excitation spectrum. In another embodiment, the high-brightness electron beam source includes a photocathode configured to emit one or more electron beams in response to the filtered illumination, wherein emission from the photocathode is adjustable based on the excitation spectrum of the filtered illumination from the tunable spectral filter.

An inspection system is disclosed, in accordance with one or more embodiments of the present disclosure. In one embodiment, the inspection system includes a high-brightness electron beam source. In another embodiment, the high-brightness electron beam source may include a broadband illumination source configured to generate broadband illumination; a tunable spectral filter configured to filter the broadband illumination to provide filtered illumination having an excitation spectrum; and a photocathode configured to emit one or more electron beams in response to the filtered illumination. In another embodiment, emission from the photocathode is adjustable based on the excitation spectrum of the filtered illumination from the tunable spectral filter. In another embodiment, the inspection system includes one or more electron focusing elements configured to direct the one or more electron beams from the high-brightness electron beam source to a sample. In another embodiment, the inspection system includes one or more detectors to detect radiation from the sample generated in response to the one or more electron beams.

A method for generating high-brightness electron beams is disclosed, in accordance with one or more embodiments of the present disclosure. In one embodiment, the method includes generating broadband illumination with a broadband illumination source. In another embodiment, the method includes filtering, with a tunable spectral filter, the broadband illumination to provide filtered illumination having an excitation spectrum. In another embodiment, the method includes emitting, with a photocathode, one or more electron beams in response to the filtered illumination, wherein emission from the photocathode is adjustable based on the excitation spectrum of the filtered illumination from the tunable spectral filter.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

Figure 1:
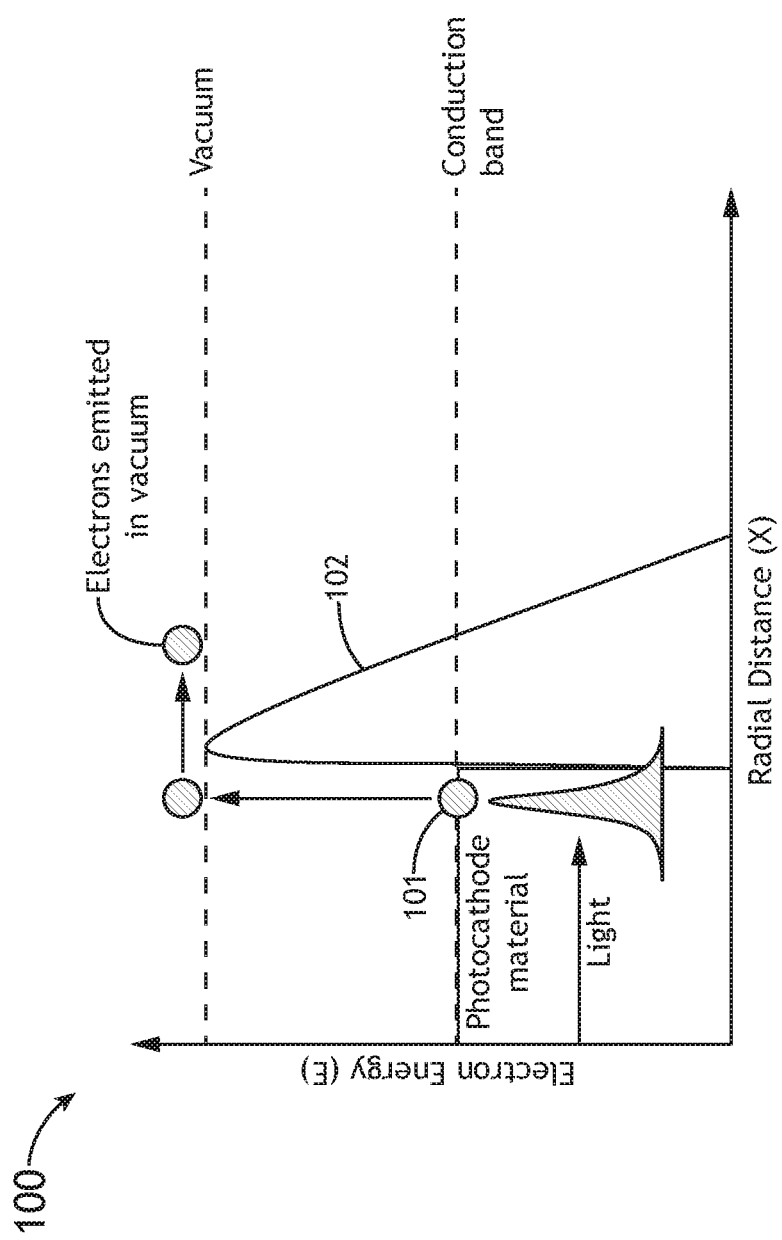
FIG. 1 illustrates an energy level diagram illustrating a photoelectric mode of a photocathode, in accordance with one or more embodiments of the present disclosure.

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

As noted previously herein, photocathodes have been utilized in multi-electron beam inspection systems in order to improve throughput in wafer and reticle inspection applications. Two of the key parameters to achieve low emittance, high-brightness photocathodes are the wavelengths and beam profiles of the laser excitation. However, the utility of photocathodes in inspection systems has been limited due to the fact that photocathode development has been largely driven by the availability of suitable laser sources. The materials to be used in photocathode inspection systems have previously been selected based upon the wavelengths which may be generated by currently available laser sources. Accordingly, photocathode materials have been selected based upon their compatibility with available laser sources, rather than for their inspection performance capabilities.

For example, in the case of spin polarized negative electron affinity (NEA) photocathodes, such as photocathodes comprising cesiated GaAs, the excitation wavelength can determine not only the quantum efficiency of the photocathode, but also the spin polarization efficiency. In this case, the excitation energy must be at or just above the material bandgap in order to maximize the quantum efficiency and spin polarization efficiency of the photoelectrons. In this example, a Ti-Sapphire laser with small tunability around 800 nm may provide illumination with the correct excitation wavelength and excitation energy.

While a Ti-Sapphire laser may be appropriate for use with cesiated GaAs cathodes, as described in the example above, this may not apply to a wide array of photocathode materials. Currently, there are few light sources which are able to provide illumination at shorter wavelengths. As such, materials with wider bandgaps and higher valence band spin split energies may be unable to be used in photocathode inspection systems due to the lack of appropriate photocathode illumination sources.

It is contemplated herein that photocathode illumination sources which are able to be tuned and/or provide shorter wavelength illumination may allow for photocathodes made of a wider array of materials. Furthermore, the ability to construct photocathodes of varying materials may improve the performance and operational lifetime of both photocathode inspection systems and photocathodes themselves.

In this regard, embodiments of the present disclosure are directed to a high-brightness electron beam source including a photocathode and a broadband illumination source. Additional embodiments of the present disclosure are directed to the use of a tunable spectral filter to generate a filtered excitation spectrum from broadband illumination. Additional embodiments of the present disclosure are directed to the use of a tunable spectral filter to filter an excitation spectrum provided to a photocathode in order to provide a selected balance between a quantum efficiency of the photocathode and an energy spread of electron beams emitted from the photocathode. Further embodiments of the present disclosure are directed to a method of generating high-brightness electron beams with a broadband illumination source and a photocathode.

It is contemplated herein that broadband illumination sources of the present disclosure may be used to improve and optimize photocathode performance in all photoemission mechanisms including, but not limited to, direct bandgap, negative electron affinity, metal work function, photoemission through defect state activation, and the like.

As noted previously herein, many photocathode materials exhibit high efficiency and stability, and are therefore highly desirable in inspection applications. However, many of these photocathode materials have large bandgaps that require high excitation energies which are difficult to achieve with commercially available lasers. In this regard, embodiments of the present disclosure are directed to the use of broadband illumination sources which may be used to provide an excitation spectrum which may be used by a wide variety of photocathode materials, including those materials with large bandgaps. Accordingly, it is contemplated herein that the use of broadband illumination sources may optimize photocathode emission energy, electron yield, and photocathode brightness.

Reference will now be made in detail to the subject matter disclosed, which is illustrated in the accompanying drawings.

Referring generally to FIGS. 1-7, a system and method for inspection utilizing a broadband illumination source and a photocathode are shown and described, in accordance with one or more embodiments of the present disclosure.

For the purposes of the present disclosure, photocathodes may be described as operating in various modes including a photoelectric mode, a photoemission mode, a multiwavelength operation mode, and an additional operational mode. Each of these modes will be described in turn.

FIG. 1 illustrates an energy level diagram 100 illustrating a photoelectric mode of a photocathode, in accordance with one or more embodiments of the present disclosure. In particular, diagram 100 illustrates a potential energy curve 102 of electrons within a photoelectric material, wherein energy (E) is measured on the Y-axis against radial distance (X) from the center of a nucleus on the X-axis.

The photoelectric effect, by definition, occurs when photo-generated electrons inside a material (e.g., semiconductor material, metal material, insulator material) are excited above the work function of the material and are emitted directly to vacuum, as shown in FIG. 1. The work function of a material may be described as the minimum amount of energy required to remove an electron from a solid material to a point in a vacuum immediately outside the surface of the solid. As it applies to photocathodes, light (e.g., illumination) may be directed to and absorbed by electrons within the photocathode material. Energy from the impinging light may thereby be transferred from the impinging light to the electrons, thereby exciting the electrons above the work function of the material and causing the electrons to be ejected from the material and emitted to a vacuum state.

As applied to FIG. 1, an electron 101 may be struck by light (e.g., illumination) with an excitation energy greater than the work function of the photocathode material. The excitation energy of the light may be transferred from the light to the electron 101, thereby exciting the electron from the conduction band of the material above the work function of the material, thereby causing the electron 101 to be emitted to a vacuum state.

A photocathode may be optimized such that it operates at or near the work function such that electrons are emitted with minimum energy. In this regard, a photocathode may be said to be optimized when the photocathode is exposed to illumination with excitation energy at or near the work function.

It is noted herein that materials such as alkali halides (e.g., CsBr, CsI, $Cs_2Te$, and the like) may operate in a photoelectric mode, as shown in FIG. 1. It is further noted herein that alkali halides may exhibit wide ranges of spectral sensitivities, as well as high quantum efficiencies at vacuum ultraviolet (VUV) to deep ultraviolet (DUV) wavelengths. For example, alkali halides may exhibit quantum efficiencies up to several percent when exposed to 200 nm illumination, and up to approximately 40% quantum efficiency when exposed to illumination around 150 nm. Due to their high quantum efficiencies with VUV and DUV wavelengths, alkali halides may be especially compatible in photocathode inspection systems utilizing broadband illumination.

While high quantum efficiency levels may be desirable, it is further noted herein that operating a photocathode with illumination far above the bandgap of the photoelectric material may lead to high levels of electron energy spread. The bandgap of a material may be defined as the energy required to remove an electron from the valence band of a material to a conduction band of the material (e.g., the energy difference between the valence band and the conduction band). In this regard, it is contemplated herein that broadband illumination may be filtered and tuned in order to optimize photocathode performance by balancing quantum efficiency of a photocathode and energy spread of electrons emitted by the photocathode.

Figure 2:
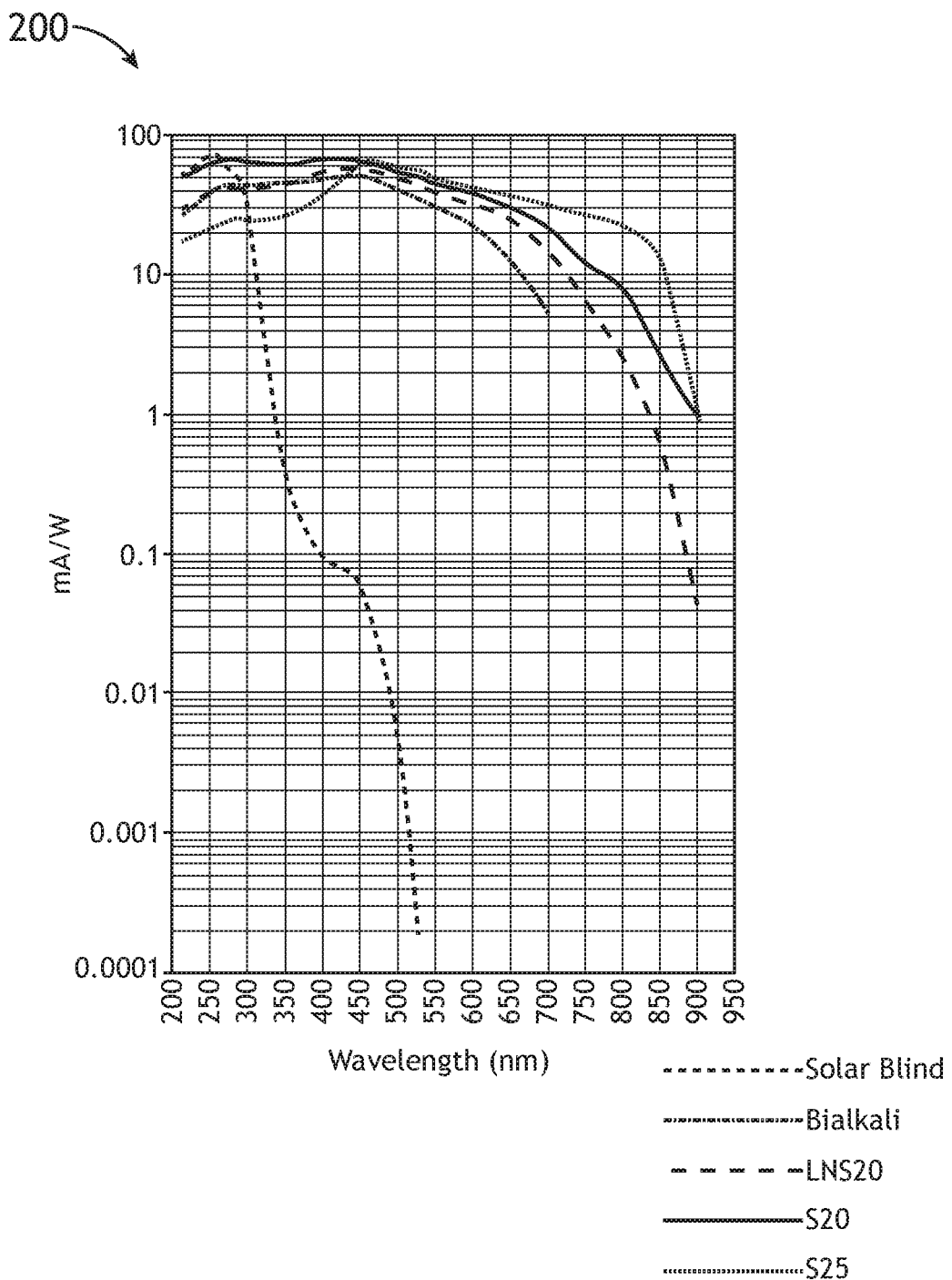
FIG. 2 shows a graph illustrating spectral responses of photocathodes of varying materials, in accordance with one or more embodiments of the present disclosure.

FIG. 2 shows a graph 200 illustrating spectral responses of photocathodes of varying materials, in accordance with one or more embodiments of the present disclosure. In particular, graph 200 illustrates the response of photocathodes to excitation wavelengths in the ultraviolet (UV), visible, and infrared (IR) wavelength ranges. It is noted herein that broadband illumination may be filtered to include excitation wavelengths (illustrated on the X-axis of graph 200) in order to achieve desired electron beam parameters.

Figure 3:
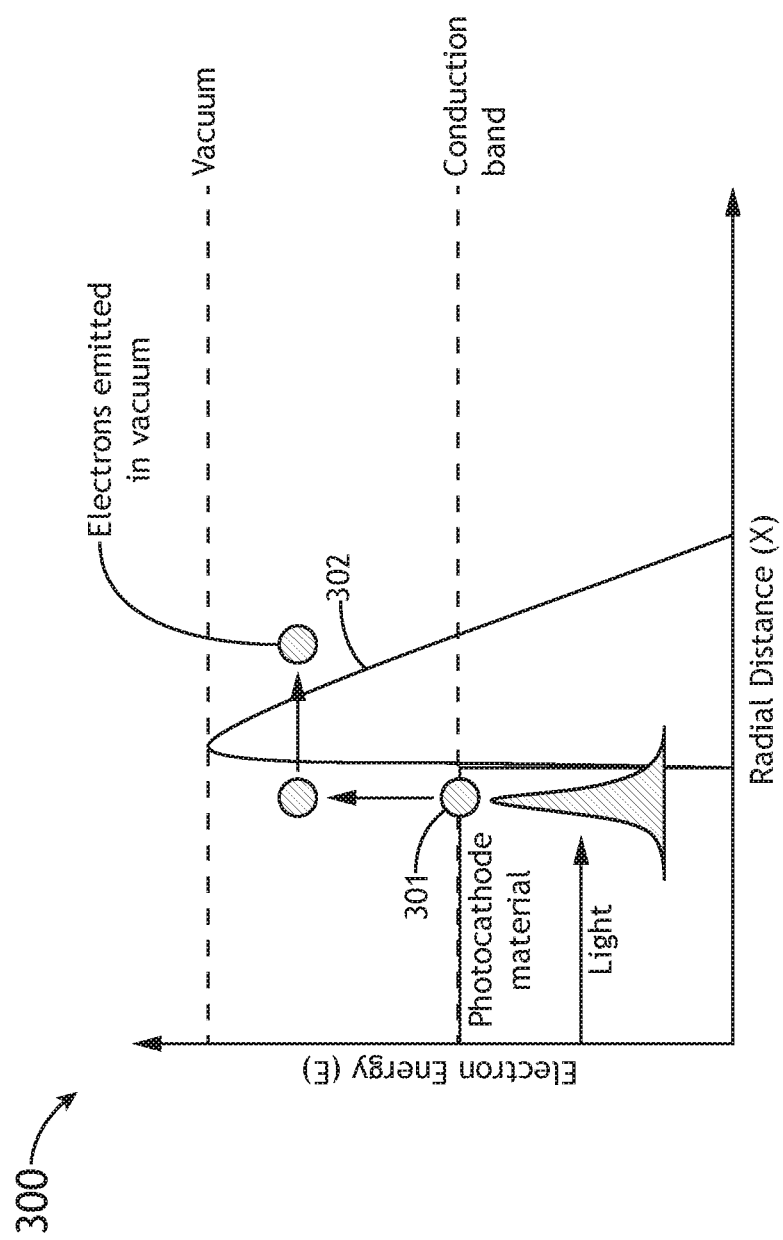
FIG. 3 illustrates an energy level diagram illustrating a photoemission mode of a photocathode, in accordance with one or more embodiments of the present disclosure.

FIG. 3 illustrates an energy level diagram 300 illustrating a photoemission mode of a photocathode, in accordance with one or more embodiments of the present disclosure. In particular, diagram 300 illustrates a potential energy curve 302 of electrons 301 within a photoelectric material, wherein energy (E) is measured on the Y-axis against radial distance (X) from the center of a nucleus on the X-axis.

As compared to the photoelectric mode, which was previously defined as operation above the work function of a material, the photoemission mode may be defined as operation below the work function of the material. In a photoemission mode, a photocathode is exposed to light (e.g., illumination) with an excitation energy below the work function. As such, energy absorbed from the impinging light is insufficient to excite electrons of the material to such an extent that the electrons are directly emitted to a vacuum state. Rather, in a photoemission mode, electrons may tunnel through an energy barrier such that the electrons tunnel into a vacuum state. In a photoemission mode, electrons may tunnel to operate according to the Schottky model, thereby minimizing electron energy spread.

It is noted herein that the use of a broadband illumination source in conjunction with a photocathode may allow for the broadband illumination to be filtered and tuned in order to dictate what mode the photocathode may operate in. For example, filtering broadband illumination to longer wavelengths (e.g., lower energy wavelengths) may cause a photocathode to operate in a photoemission mode. Conversely, filtering broadband illumination to shorter wavelengths (e.g., higher energy wavelengths) may cause a photocathode to operate in a photoelectric mode.

Figure 4:
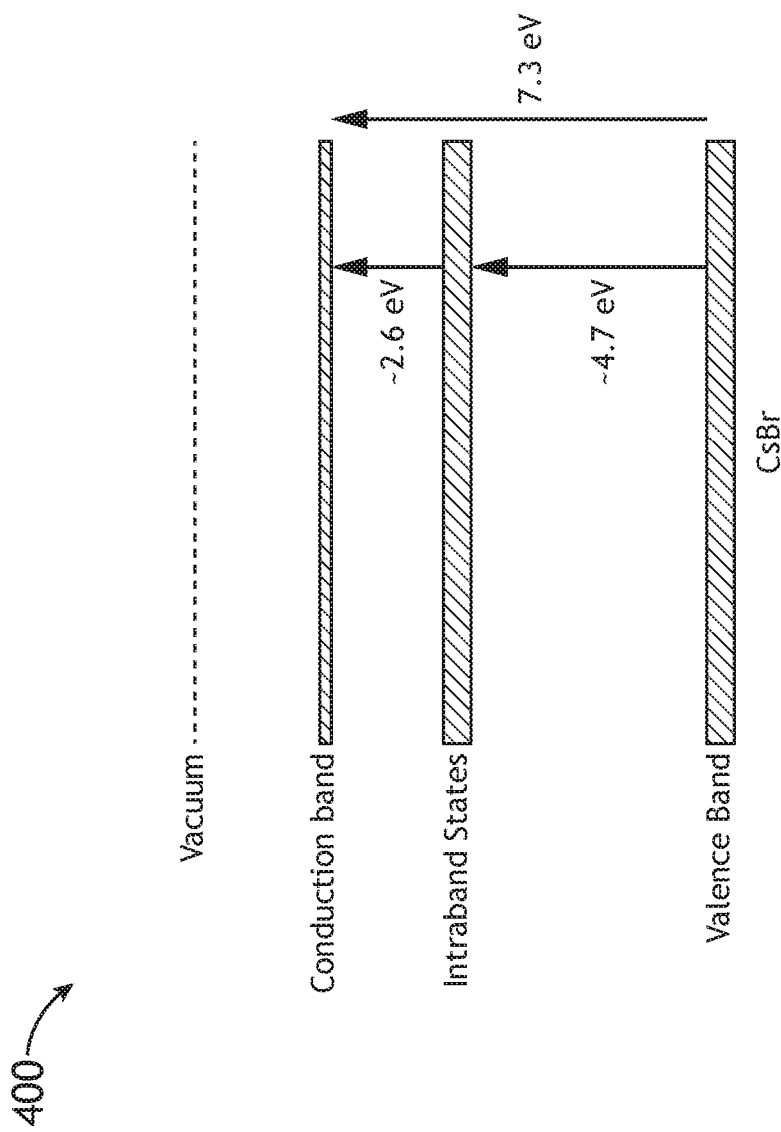
FIG. 4 illustrates an energy level diagram illustrating a multiwavelength mode of a photocathode, in accordance with one or more embodiments of the present disclosure.

FIG. 4 illustrates an energy level diagram 400 illustrating a multiwavelength mode of a CsBr photocathode, in accordance with one or more embodiments of the present disclosure.

It is noted herein that some photocathode materials may have to be operated in a multiwavelength mode in order to be compatible for use within an inspection system. In a multiwavelength mode, light with a first wavelength (or a first narrow band of wavelengths) is used to excite electrons in a photocathode material to an excited, intermediate electronic band (e.g., resonant electronic band) or energy trap. Subsequently, light with a second wavelength (or a second narrow band of wavelengths) is used to excite the electrons from the intermediate resonant electronic band or energy trap to the vacuum state, where the electrons may be emitted. In this regard, a multiwavelength mode utilizes a stepwise mechanism to achieve electron beam emission from a photocathode.

For example, diagram 400 in FIG. 4 illustrates a multiwavelength mode of a CsBr photocathode. In a multiwavelength mode, pumping the CsBr photocathode with light exhibiting an energy level between approximately 4.6 eV and approximately 7.2 eV may cause electrons within the CsBr photocathode to be excited from the valence band to one or more intraband energy states (e.g., resonant electronic band). For instance, pumping the CsBr photocathode with light of a first wavelength with energy between 4.6-7.2 eV may excite electrons from the valence band of the CsBr photocathode to an intraband energy state with an energy level approximately 4.7 eV greater than the valence band. Continuing with the same example, pumping the CsBr photocathode with light exhibiting energies greater than 2.4 eV may excite the electrons in the one or more intraband energy states to the vacuum state, where the electrons may be emitted. For instance, pumping the CsBr photocathode with light of a second wavelength with energies of approximately 2.6 eV may excite electrons from the intraband energy state to the vacuum state, where the electrons may be emitted.

In one embodiment, broadband illumination sources of the present disclosure may be filtered and tuned in order to pump photocathodes with wavelengths designed to optimize a multiwavelength operation mode. For example, referring to FIG. 4, broadband illumination from a broadband illumination source may be filtered such that the CsBr photocathode is pumped with light exhibiting a first energy level of approximately 4.7 eV, and light exhibiting a second energy level of approximately 2.6 eV. It is noted herein that the ability to tune broadband illumination in order to pump photocathodes with various wavelengths or wavelength bands provides increased flexibility, and allows the system and method of the present disclosure to more efficiently and effectively optimize photocathodes produced with various materials.

Another alternative operation mode may apply to photocathodes produced with semiconductors and/or engineered materials. In this alternative operation mode, a photocathode may be pumped with illumination in order to excite electrons from the valence band of the photocathode material to one or more intermediate electronic bands (e.g., resonant electronic bands) or energy traps. Subsequently, an electric field or current may be applied to the photocathode in order to tunnel the electrons out of the intermediate trapped states into the vacuum level. It is noted herein that the alternative operation mode may require a very specific wavelength and/or a very narrow band of wavelengths in order to optimize the operation of the photocathode. It is further noted herein that the alternative operation mode may be similar to the multiwavelength mode to the extent that the alternative operation mode uses a stepwise technique in order to generate one or more electron beams with a photocathode material.

Figure 5A:
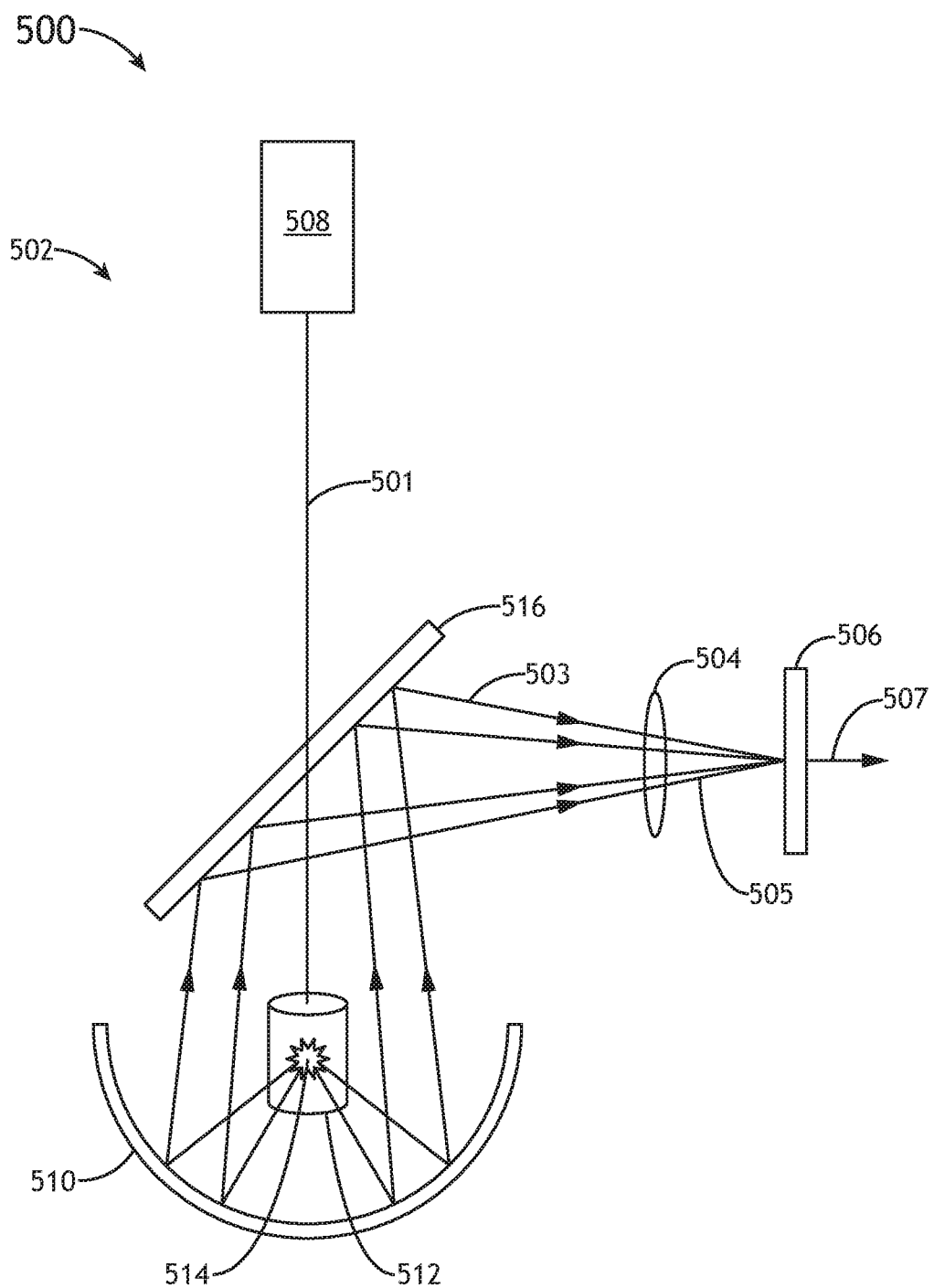
FIG. 5A illustrates a high-brightness electron beam source, in accordance with one or more embodiments of the present disclosure.

FIG. 5A illustrates a high-brightness electron beam source 500, in accordance with one or more embodiments of the present disclosure. The high-brightness electron beam source 500 (hereinafter "electron beam source 500") may include, but is not limited to, a broadband illumination source 502, one or more optical elements 504, and a photocathode 506.

In one embodiment, the broadband illumination source 502 is configured to generate broadband illumination 503. The broadband illumination 503 generated from the broadband illumination source 502 may include, but is not limited to, vacuum ultraviolet (VUV) illumination, ultraviolet (UV) illumination, visible illumination, near infrared (NIR) illumination, and infrared (IR) illumination. The broadband illumination source 502 may include any broadband illumination source configured to generate broadband illumination including, but not limited to, laser-produced plasma sources, laser-sustained plasma (LSP) sources, supercontinuum lasers, white-light lasers, fiber lasers, tunable optical parametric sources (e.g., optical parametric oscillator, optical parametric amplifier, and the like), and the like. Additionally, the broadband illumination source 502 may include a continuous-wave (CW) illumination source or a pulsed illumination source.

For example, the electron beam source 500 illustrated in FIG. 5A includes a broadband illumination source 502 comprising a laser-sustained plasma (LSP) source. In this regard, the broadband illumination source 502 may include, but is not limited to, a pump source 508, a reflector element 510, a plasma lamp 512 configured to contain a plasma 514, and a cold mirror 516.

In one embodiment, the pump source 508 is configured to generate pump illumination 501 and direct the pump illumination to the plasma lamp 512. The pump source 508 may include any illumination source configured to pump plasma known in the art including, but not limited to, one or more continuous-wave (CW) lasers, one or more pulsed lasers, one or more fiber lasers, and the like.

In another embodiment, pump illumination 501 is directed to a volume of gas contained within the plasma lamp 512 in order to generate a plasma 514 within the volume of gas. The plasma lamp 512 may include any plasma lamps known in the art for generating a plasma 514. Similarly, the volume of gas contained within the plasma lamp 512 may include any gas or mixture of gasses known in the art for generating and sustaining a plasma including, but not limited to, xenon (Xe), argon (Ar), and the like.

In another embodiment, the plasma 514 generated and sustained within the plasma lamp 512 may generate broadband illumination 503. The broadband illumination 503 generated from the broadband illumination source 502 may include, but is not limited to, vacuum ultraviolet (VUV) illumination, ultraviolet (UV) illumination, visible illumination, near infrared (NIR) illumination, and infrared (IR) illumination. In another embodiment, broadband illumination 503 generated by the plasma 514 may be directed by a reflector element 510 to a cold mirror 516. The reflector element 510 may include any reflector element known in the art. For example, as shown in FIG. 5A, the reflector element 510 may include an elliptical reflector element 510. In another embodiment, a cold mirror 516 may be configured to direct broadband illumination 503 from the reflector element 510 to the one or more optical elements 504. The cold mirror 516 may include any optical element known in the art including, but not limited to, a beam splitter, a sampler, a filter, and the like.

In one embodiment, the one or more optical elements 504 are configured to receive broadband illumination 503 and direct filtered illumination 505 having an excitation spectrum to the photocathode 506. The one or more optical elements 504 may include any optical elements known in the art. For example, the one or more optical elements may include one or more spectral filters. By way of another example, the one or more optical elements 504 may include one or more tunable spectral filters. By further way of example, the one or more optical elements 504 may include one or more mirrors, one or more lenses, one or more prisms, one or more color filters, one or more beam splitters, one or more bandpass filters, one or more monochromators, and the like.

It is contemplated herein that the one or more optical elements 504 may include one or more spectral filters configured to receive broadband illumination 503 and produce filtered illumination 505 having an excitation spectrum. However, the term "filtered illumination 505" is not to be regarded as a limitation of the present disclosure, unless noted otherwise herein. In this regard, the one or more optical elements 504 may include one or more mirrors and/or lenses such that the "filtered illumination 505" comprises un-filtered broadband illumination 503.

In another embodiment, the one or more optical elements 504 are configured to filter (e.g., tune) the broadband illumination 503 in order to produce filtered illumination 505 with particular characteristics and/or a particular excitation spectrum. In this regard, it is contemplated herein that the one or more optical elements 504 may alter and/or modify one or more characteristics of the broadband illumination 503 in order to optimize operation of the photocathode 506. For example, the one or more optical elements 504 may include one or more tunable spectral filters which are configured to filter the broadband illumination 503 to produce filtered illumination 505 having a particular excitation spectrum which is configured to optimize operation of the photocathode 506. The excitation spectrum of the filtered illumination 505 may be configured to achieve particular operation modes of the photocathode 506. For example, the one or more optical elements 504 may be configured to produce filtered illumination 505 having an excitation spectrum which is configured to cause the photocathode 506 to operate in a photoelectric mode. By way of another example, the one or more optical elements 504 may be configured to produce filtered illumination 505 having an excitation spectrum which is configured to cause the photocathode 506 to operate in a photoemission mode. By way of another example, the one or more optical elements 504 may be configured to produce filtered illumination 505 having an excitation spectrum which is configured to cause the photocathode 506 to operate in a multiwavelength mode or an alternative operation mode.

As noted previously herein, the excitation spectrum provided to a photocathode 506 may determine both the quantum efficiency of the photocathode 506 and the energy spread of one or more electron beams 507 emitted from the photocathode 506. Accordingly, in another embodiment, the one or more optical elements 504 may be configured to produce filtered illumination 505 with a particular excitation spectrum which is configured to provide a selected balance between quantum efficiency of the photocathode 506 and an energy spread of the one or more electron beams 507 emitted from the photocathode 506. The selected balance between quantum efficiency and energy spread may be based on any number of factors including, but not limited to, a desired quantum efficiency level, a minimum quantum efficiency level, a desired energy spread, a maximum energy spread level, a desired ratio of quantum efficiency to energy spread, and the like.

It is noted herein that the ability to provide filtered illumination 505 which is tailored to a particular photocathode 506 material may increase the efficiency of the photocathode 506. Furthermore, filtered illumination 505 tailored for particular photocathode 506 material may increase the brightness of the one or more electron beams 507 generated by the photocathode 506. It is further noted herein that tailored filtered illumination 505 may provide a number of additional benefits including, but not limited to, increased versatility, improved photocathode 506 performance, increased photocathode 506 lifetime, increased electron beam 507 stability, and decreased electron beam 507 noise. In particular, it is noted herein that the use a broadband illumination source 502 (e.g., tunable broadband illumination 503) may improve the stability of the generated electron beams 507 over the stability which may be provided by lasers used in previous approaches. This improved stability results in higher electron beam 507 performance, and improved inspection system performance and throughput.

Additionally, it is noted herein that the use of broadband illumination source 502 (e.g., tunable broadband illumination 503) may result in minimum power and thermal dissipation on the photocathode 506. Furthermore, it is contemplated herein that the use of broadband illumination sources 502 may provide for large power scalability in multiple electron beam inspection systems which is not possible with previous laser-based approaches. Lastly, it is contemplated herein that the use of broadband illumination sources 502 of the present disclosure may allow for a wider range of photocathode 506 materials to be commercially feasible, as the filtered illumination 505 used to pump the photocathode may be tailored to the photocathode 506 material parameters.

In another embodiment, the one or more optical elements 504 are configured to direct filtered illumination 505 to the photocathode 506. In another embodiment, the photocathode 506 is configured to receive the filtered illumination 505 and generate one or more electron beams 507 in response to the filtered illumination 505. The one or more electron beams 507 may include a single electron beam 507, a plurality of electron beams 507, and the like. In this regard, it is contemplated herein that the electron beam source 500 may be implemented in a single electron beam inspection system, a multiple electron beam inspection system, and/or a multi-column electron beam inspection system. In another embodiment, the one or more electron beams 507 may include continuous electron beams 507 or pulsed electron beams 507. For example, the one or more electron beams 507 may include one or more pulsed electron beams 507 when the pump source 508 includes a pulsed pump source 508. By way of another example, the one or more electron beams 507 may include one or more continuous electron beams 507 when the pump source 508 includes a continuous-wave (CW) pump source 508.

The photocathode 506 may be produced with any material known in the art for generating one or more electron beams 507 including, but not limited to, one or more alkali halides (e.g., CsBr, CsI, $Cs_2Te$, and the like), GaN, GaAs, CsTe, CsK tellurides, cesium antimonides (e.g., $Cs_3Sb$), and the like. Additionally, the photocathode 506 may include any photoemission configuration known in the art. For example, the photocathode 506 may include a planar photocathode. By way of another example, the photocathode 506 may include a planar photocathode with periodically patterned structures. By way of another example, the photocathode may include a single emission structure (e.g., single emission tip). Alternatively, the photocathode 506 may include an array of emission structures (e.g., an array of emission tips).

It is noted herein that the characteristics and properties of a photocathode 506 may change throughout the operative lifetime of the photocathode 506. In this regard, it is contemplated herein that one or more characteristics of the electron beam source 500 (e.g., characteristics of pump source 508, characteristics of the one or more optical elements 504, and the like) may be adjusted in order to optimize the performance of the photocathode 506 throughout the lifetime of the photocathode 506.

Figure 5B:
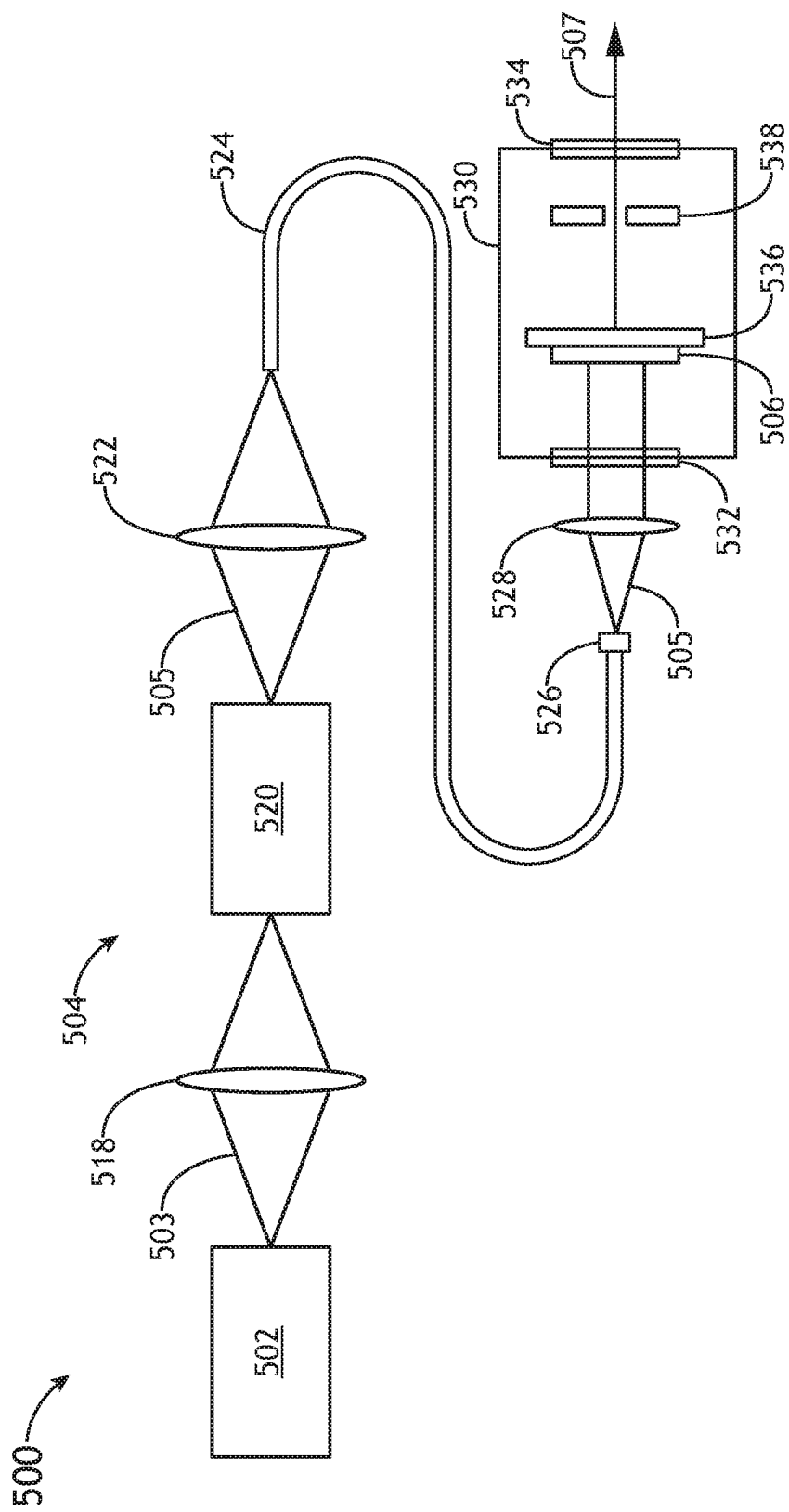
FIG. 5B illustrates a high-brightness electron beam source, in accordance with one or more embodiments of the present disclosure.

FIG. 5B illustrates a high-brightness electron beam source 500, in accordance with one or more embodiments of the present disclosure. The high-brightness electron beam source 500 (hereinafter "electron beam source 500") may include, but is not limited to, a broadband illumination source 502, one or more optical elements 504, and a photocathode 506. It is noted herein that any description associated with the electron beam source 500 depicted in FIG. 5A may be regarded as applying to the electron beam source 500 depicted in FIG. 5B, unless noted otherwise herein. Conversely, any description associated with the electron beam source 500 depicted in FIG. 5B may be regarded as applying to the electron beam source 500 depicted in FIG. 5A, unless noted otherwise herein.

In one embodiment, the broadband illumination source 502 is configured to generate broadband illumination 503. In another embodiment, the one or more optical elements 504 may include a condenser lens 518, a monochromator 520, a fiber-coupling lens 522, fiber optics (e.g., a fiber 524), a collimator 526, and an objective lens 528 (e.g., focusing lens). In this regard, the one or more optical elements 504 may include any optical elements known in the art configured to modify one or more characteristics of the broadband illumination 503 and direct the broadband illumination 503 to the photocathode 506. Accordingly, the one or more optical elements 504 may include fewer, additional, and/or alternative optical elements as those depicted in FIG. 5B.

In one embodiment, the condenser lens 518 is configured to receive broadband illumination 503 from the broadband illumination source 502 and direct the broadband illumination 503 to the monochromator 520. In another embodiment, the monochromator 520 is configured to filter and/or tune the broadband illumination 503 in order to generate filtered illumination 505 having an excitation spectrum. As noted previously herein, the monochromator 520 may be configured to generate filtered illumination 505 with a particular excitation spectrum in order to optimize the performance of the photocathode 506. In this regard, the monochromator 520 may be configured to generate filtered illumination 505 with a particular excitation spectrum tailored to the material of the photocathode 506. For example, monochromator 520 may be configured to produce filtered illumination 505 with a particular excitation spectrum which is configured to provide a selected balance between quantum efficiency of the photocathode 506 and an energy spread of the one or more electron beams 507 emitted from the photocathode 506.

In another embodiment, the monochromator 520 is configured to direct the filtered illumination 505 to a fiber-coupling lens 522. The fiber-coupling lens 522 may be configured to couple and direct the filtered illumination 505 to a fiber 524. Similarly, the fiber 524 may be configured to direct the filtered illumination 505 to the photocathode 506. In one embodiment, a collimator 526 is configured to receive filtered illumination 505 from the fiber 524 and direct the filtered illumination 505 to the photocathode 506. In another embodiment, the collimator 526 is configured to shape the beam profile of the filtered illumination 505. As may be seen in FIG. 5A and FIG. 5B, it is contemplated herein that the electron beam source 500 of the present disclosure may include various modes of operation, including optical transmission via free space and fiber optics.

In another embodiment, an objective lens 528 is configured to receive the filtered illumination 505 from the fiber 524 and/or collimator 526 and direct the filtered illumination 505 to the photocathode 506 contained within a vacuum chamber 530. In one embodiment, the vacuum chamber 530 includes an entry window 532 and an exit window 534. In another embodiment, the vacuum chamber 530 is configured to contain an aperture 538 and the photocathode 506 disposed on a photocathode stage 536.

In one embodiment, the objective lens 528 is configured to direct filtered illumination 505 to the entry window 532 of the vacuum chamber 530. The entry window 532 may include any optical element configured to pass filtered illumination 505 into the vacuum chamber 530 including, but not limited to, one or more ports, one or more windows, one or more lenses, and the like. In another embodiment, filtered illumination 505 may be directed through the entry window 532 to the photocathode 506 disposed on the photocathode stage 536. In another embodiment, the photocathode stage 536 may be configured to facilitate movement of the photocathode 506. In this regard, the photocathode stage 536 may include an actuatable stage configured to translate the photocathode 506 along one or more linear directions (e.g., x-direction, y-direction and/or z-direction). By way of another example, the photocathode stage 536 may include, but is not limited to, one or more rotational stages suitable for selectively rotating the photocathode 506 along a rotational direction. By way of another example, the photocathode stage 536 may include, but is not limited to, a rotational stage and a translational stage suitable for selectably translating the photocathode 506 along a linear direction and/or rotating the photocathode 506 along a rotational direction.

In another embodiment, the photocathode 506 may be configured to emit one or more electron beams 507 in response to the filtered illumination 505. The one or more electron beams 507 may include a single electron beam 507, a plurality of electron beams 507, and the like. In this regard, it is contemplated herein that the electron beam source 500 may be implemented in a single electron beam inspection system, a multiple electron beam inspection system, and/or a multi-column electron beam inspection system.

In another embodiment, the one or more electron beams 507 are directed to an aperture 538. The aperture 538 may be configured to alter one or more characteristics of the one or more electron beams 507. For example, the aperture 538 may be configured to modify the shape of the one or more electron beams 507. In another embodiment, the one or more electron beams 507 are directed out of the vacuum chamber 530 via the exit window 534. The exit window 534 may include any optical element configured to pass the one or more electron beams 507 into the vacuum chamber 530 including, but not limited to, one or more ports, one or more electron-optical windows, one or more electron-optical lenses, and the like.

Figure 6:
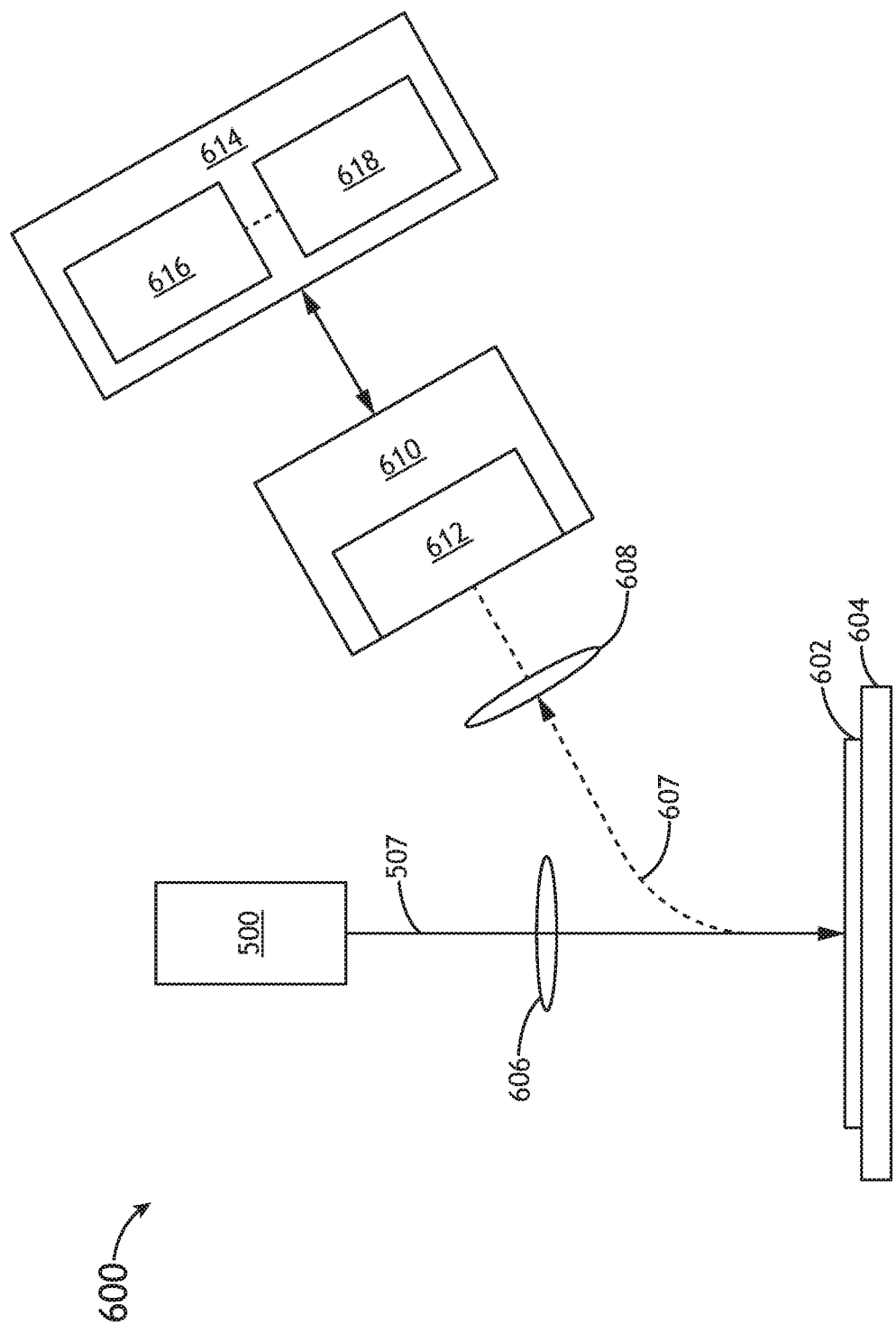
FIG. 6 illustrates an optical characterization system utilizing a high-brightness electron beam source, in accordance with one or more embodiments of the present disclosure.

FIG. 6 illustrates an optical characterization system 600 utilizing a high-brightness electron beam source 500, in accordance with one or more embodiments of the present disclosure. The optical characterization system 600 may include any characterization system known in the art including, but not limited to, an inspection system, a review system, an image-based metrology system, and the like. In this regard, system 600 may be configured to perform inspection, review, or image-based metrology on a sample 602.

Optical characterization system 600 may include, but is not limited to, electron beam source 500, one or more optical elements 606, a sample 602 disposed on a sample stage 604, one or more optical elements 608, a detector assembly 610, and a controller 614 including one or more processors 616 and a memory 618.

In one embodiment, the electron beam source 500 of system 600 is configured to direct the one or more electron beams 507 to the sample 602. The electron beam source 500 may form an electron-optical column. In another embodiment, electron beam source 500 includes one or more additional and/or alternative electron-optical elements 606 configured to focus and/or direct the one or more electron beams 507 to the surface of the sample 602. In another embodiment, system 600 includes one or more electron-optical elements 608 configured to collect secondary electrons 607 emanated from the surface of the sample 602 in response to the one or more electron beams 507. It is noted herein that the one or more electron-optical elements 606 and the one or more electron-optical elements 608 may include any electron-optical elements configured to direct, focus, and/or collect electrons including, but not limited to, one or more deflectors, one or more electron-optical lenses, one or more condenser lenses (e.g., magnetic condenser lenses), one or more objective lenses (e.g., magnetic objective lenses), and the like.

Sample 602 may include any sample known in the art including, but not limited to, a wafer, a reticle, a photomask, and the like. In one embodiment, sample 602 is disposed on a stage assembly 604 to facilitate movement of sample 602. In another embodiment, the stage assembly 604 is an actuatable stage. For example, the stage assembly 604 may include, but is not limited to, one or more translational stages suitable for selectably translating the sample 602 along one or more linear directions (e.g., x-direction, y-direction and/or z-direction). By way of another example, the stage assembly 604 may include, but is not limited to, one or more rotational stages suitable for selectively rotating the sample 602 along a rotational direction. By way of another example, the stage assembly 604 may include, but is not limited to, a rotational stage and a translational stage suitable for selectably translating the sample 602 along a linear direction and/or rotating the sample 602 along a rotational direction. It is noted herein that the system 600 may operate in any scanning mode known in the art.

It is noted that the electron optical assembly of the electron beam source 500 and/or system 600 is not limited to the electron-optical elements depicted in FIG. 6, which are provided merely for illustrative purposes. It is further noted that the system 600 may include any number and type of electron-optical elements necessary to direct/focus the one or more electron beams 507 onto the sample 602 and, in response, collect and image the emanated secondary electrons 607 onto the detector assembly 610.

For example, the system 600 may include one or more electron beam scanning elements (not shown). For instance, the one or more electron beam scanning elements may include, but are not limited to, one or more electromagnetic scanning coils or electrostatic deflectors suitable for controlling a position of the one or more electron beams 507 relative to the surface of the sample 602. Further, the one or more scanning elements may be utilized to scan the one or more electron beams 507 across the sample 602 in a selected pattern.

In another embodiment, secondary electrons 607 are directed to one or more sensors 612 of a detector assembly 610. The detector assembly 610 of the system 600 may include any detector assembly known in the art suitable for detecting multiple secondary electrons 607 from the surface of the sample 602. In one embodiment, the detector assembly 610 includes an electron detector array. In this regard, the detector assembly 610 may include an array of electron-detecting portions. Further, each electron-detecting portion of the detector array of the detector assembly 610 may be positioned so as to detect an electron signal from sample 602 associated with one of the incident one or more electron beams 507. In this regard, each channel of the detector assembly 610 may correspond to an electron beam 507 of the one or more electron beams 507. The detector assembly 610 may include any type of electron detector known in the art. For example, the detector assembly 610 may include a micro-channel plate (MCP), a PIN or p-n junction detector array, such as, but not limited to, a diode array or avalanche photo diodes (APDs). By way of another example, the detector assembly 610 may include a high-speed scintillator/PMT detector.

While FIG. 6 illustrates the system 600 as including a detector assembly 610 comprising only a secondary electron detector assembly, this is not to be regarded as a limitation of the present disclosure. In this regard, it is noted that the detector assembly 610 may include, but is not limited to, a secondary electron detector, a backscattered electron detector, and/or a primary electron detector (e.g., an in-column electron detector). In another embodiment, system 600 may include a plurality of detector assemblies 610. For example, system 600 may include a secondary electron detector assembly 610, a backscattered electron detector assembly 610, and an in-column electron detector assembly 610.

In another embodiment, detector assembly 610 is communicatively coupled to a controller 614 including one or more processors 616 and memory 618. For example, the one or more processors 616 may be communicatively coupled to memory 618, wherein the one or more processors 616 are configured to execute a set of program instructions stored on memory 618. In one embodiment, the one or more processors 616 are configured to analyze the output of detector assembly 610. In one embodiment, the set of program instructions are configured to cause the one or more processors 616 to analyze one or more characteristics of sample 602. In another embodiment, the set of program instructions are configured to cause the one or more processors 616 to modify one or more characteristics of system 600 in order to maintain focus on the sample 602 and/or the sensor 612. For example, the one or more processors 616 may be configured to adjust one or more characteristics of the electron beam source 500, or the one or more optical elements 606 in order to focus of the one or more electron beams 507 from electron beam source 500 onto the surface of the sample 602. By way of another example, the one or more processors 616 may be configured to adjust the one or more optical elements 608 in order to collect illumination from the surface of the sample 602 and focus the collected illumination on the sensor 612. By way of another example, the one or more processors 616 may be configured to adjust one or more focusing voltages applied to one or more electrostatic deflectors of electron beam source 500 in order to independently adjust the position or alignment of the one or more electron beams 507.

It is noted herein that the one or more components of system 600 may be communicatively coupled to the various other components of system 600 in any manner known in the art. For example, the one or more processors 616 may be communicatively coupled to each other and other components via a wireline (e.g., copper wire, fiber optic cable, and the like) or wireless connection (e.g., RF coupling, IR coupling, data network communication (e.g., WiFi, WiMax, Bluetooth and the like)). By way of another example, the one or more processors may be communicatively coupled to one or more components of the electron beam source 500 including, but not limited to, the pump source 508, the one or more optical elements 504 (e.g., tunable spectral filter, monochromator 520, photocathode stage 536, and the like), and the like.

In one embodiment, the one or more processors 616 may include any one or more processing elements known in the art. In this sense, the one or more processors 616 may include any microprocessor-type device configured to execute software algorithms and/or instructions. In one embodiment, the one or more processors 616 may consist of a desktop computer, mainframe computer system, workstation, image computer, parallel processor, or other computer system (e.g., networked computer) configured to execute a program configured to operate the system 600, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 616. In general, the term "processor" may be broadly defined to encompass any device having one or more processing elements, which execute program instructions from memory 618. Moreover, different subsystems of the system 600 (e.g., electron beam source 500, detector assembly 610, controller 614, and the like) may include processor or logic elements suitable for carrying out at least a portion of the steps described throughout the present disclosure. Therefore, the above description should not be interpreted as a limitation on the present disclosure but merely an illustration.

The memory 618 may include any storage medium known in the art suitable for storing program instructions executable by the associated one or more processors 616. For example, the memory 618 may include a non-transitory memory medium. For instance, the memory 618 may include, but is not limited to, a read-only memory (ROM), a random access memory (RAM), a magnetic or optical memory device (e.g., disk), a magnetic tape, a solid state drive and the like. It is further noted that memory 618 may be housed in a common controller housing with the one or more processors 616. In an alternative embodiment, the memory 618 may be located remotely with respect to the physical location of the processors 616, controller 614, and the like. In another embodiment, the memory 618 maintains program instructions for causing the one or more processors 616 to carry out the various steps described through the present disclosure.

Figure 7:
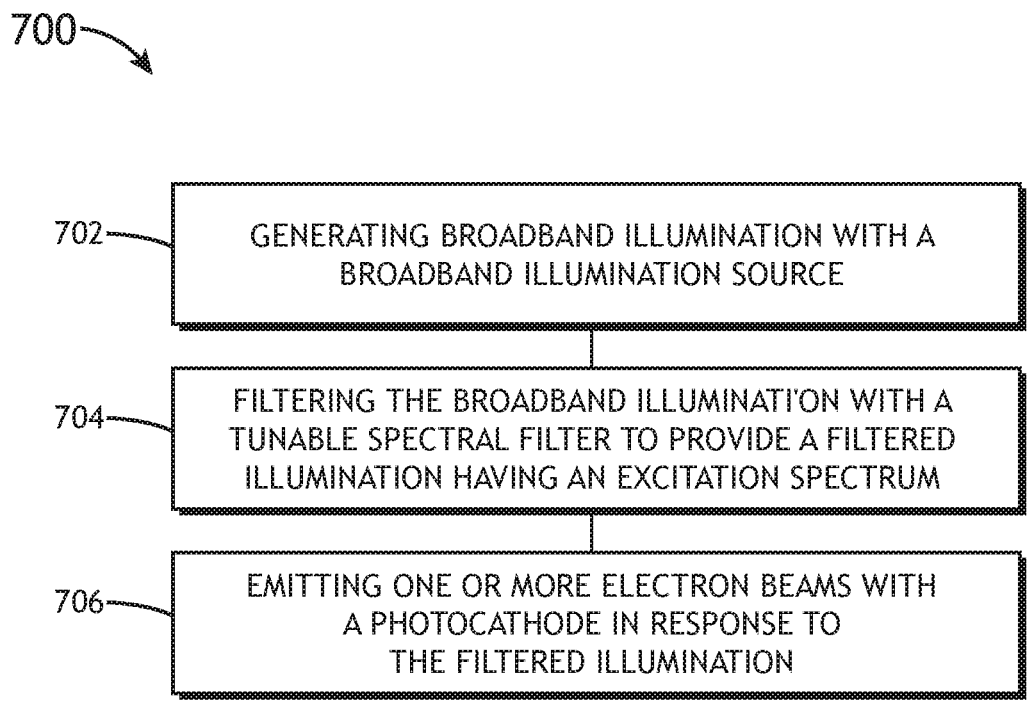
FIG. 7 illustrates a flowchart of a method for generating high-brightness electron beams, in accordance with one or more embodiments of the present disclosure.

FIG. 7 illustrates a flowchart of a method for generating high-brightness electron beams, in accordance with one or more embodiments of the present disclosure. It is noted herein that the steps of method 700 may be implemented all or in part by electron beam source 500 and/or system 600. It is further recognized, however, that the method 700 is not limited to the electron beam source 500 and/or system 600 in that additional or alternative system-level embodiments may carry out all or part of the steps of method 700.

In step 702, broadband illumination is generated with a broadband illumination source. For example, a broadband illumination source 502 may be configured to generate broadband illumination 503, as shown in FIGS. 5A-5B. The broadband illumination 503 generated from the broadband illumination source 502 may include, but is not limited to, vacuum ultraviolet (VUV) illumination, ultraviolet (UV) illumination, visible illumination, near infrared (NIR) illumination, and infrared (IR) illumination. The broadband illumination source 502 may include any broadband illumination source configured to generate broadband illumination including, but not limited to, laser-produced plasma sources, laser-sustained plasma (LSP) sources, supercontinuum lasers, white-light lasers, fiber lasers, tunable optical parametric sources (e.g., optical parametric oscillator, optical parametric amplifier, and the like), and the like. Additionally, the broadband illumination source 502 may include a continuous-wave (CW) illumination source or a pulsed illumination source.

In step 704, the broadband illumination is filtered with a tunable spectral filter to provide a filtered illumination having an excitation spectrum. For example, the one or more optical elements 504 may be configured to filter (e.g., tune) the broadband illumination 503 in order to produce filtered illumination 505 with particular characteristics and/or a particular excitation spectrum. For example, the one or more optical elements 504 may include one or more tunable spectral filters which are configured to filter the broadband illumination 503 to produce photocathode pumping illumination 505 of a particular excitation spectrum which is configured to optimize operation of the photocathode 506.

The excitation spectrum of the photocathode pumping illumination 505 may be configured to achieve particular operation modes of the photocathode 506. For example, the one or more optical elements 504 may be configured to produce an excitation spectrum (e.g., excitation spectrum of filtered illumination 505) which is configured to cause the photocathode 506 to operate in a photoelectric mode. By way of another example, the one or more optical elements 504 may be configured to produce an excitation spectrum which is configured to cause the photocathode 506 to operate in a photoemission mode. By way of another example, the one or more optical elements 504 may be configured to produce an excitation spectrum which is configured to cause the photocathode 506 to operate in a multiwavelength mode or an alternative operation mode.

In step 706, one or more electron beams are emitted by the photocathode in response to the filtered illumination. The photocathode 506 may be produced with any material known in the art for generating one or more electron beams 507 including, but not limited to, one or more alkali halides (e.g., CsBr, CsI, $Cs_2Te$, and the like), GaN, GaAs, CsTe, CsK tellurides, cesium antimonides (e.g., $Cs_3Sb$), and the like. Additionally, the photocathode 506 may include any photoemission configuration known in the art. For example, the photocathode 506 may include a planar photocathode. By way of another example, the photocathode 506 may include a planar photocathode with periodically patterned structures. By way of another example, the photocathode may include a single emission structure (e.g., single emission tip). Alternatively, the photocathode 506 may include an array of emission structures (e.g., an array of emission tips).

The one or more electron beams 507 may include a single electron beam 507, a plurality of electron beams 507, and the like. In this regard, it is contemplated herein that the electron beam source 500 may be implemented in a single electron beam inspection system, a multiple electron beam inspection system, and a multi-column electron beam inspection system. In another embodiment, the one or more electron beams 507 may include continuous electron beams 507 or pulsed electron beams 507. For example, the one or more electron beams 507 may include one or more pulsed electron beams 507 when the pump source 508 includes a pulsed pump source. By way of another example, the one or more electron beams 507 may include one or more continuous electron beams 507 when the pump source 508 includes a continuous-wave (CW) pump source.

It is noted herein that the one or more components of the disclosed system may be communicatively coupled to the various other components of the system in any manner known in the art. For example, the [elements of system] may be communicatively coupled to each other and other components via a wireline (e.g., copper wire, fiber optic cable, and the like) or wireless connection (e.g., RF coupling, IR coupling, data network communication (e.g., WiFi, WiMax, Bluetooth and the like).

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," "temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A high-brightness electron beam source comprising:
a broadband illumination source configured to generate broadband illumination;
a tunable spectral filter configured to filter the broadband illumination to provide filtered illumination having an excitation spectrum; and
a photocathode configured to emit one or more electron beams in response to the filtered illumination, wherein emission from the photocathode is adjustable based on the excitation spectrum of the filtered illumination from the tunable spectral filter,
wherein the tunable spectral filter is configured to generate the excitation spectrum including a first wavelength band configured to pump electrons in the photocathode to at least one intraband energy state, and a second wavelength band different from the first wavelength band, the second wavelength band configured to pump the electrons from the at least one intraband energy state to a vacuum state.

2. The high-brightness electron beam source of claim 1, wherein the photocathode comprises:
an alkali halide photocathode.

3. The high-brightness electron beam source of claim 2, wherein the alkali halide photocathode comprises:
at least one of CsBr, CsI, and $Cs_2Te$.

4. The high-brightness electron beam source of claim 1, wherein the tunable spectral filter is configured to provide the excitation spectrum selected to provide a selected balance between quantum efficiency of the photocathode and an energy spread of the one or more electron beams.

5. The high-brightness electron beam source of claim 1, wherein the tunable spectral filter is configured to provide the excitation spectrum selected to provide emission from the photocathode in photoelectric mode.

6. The high-brightness electron beam source of claim 1, wherein the tunable spectral filter is configured to provide the excitation spectrum selected to provide emission from the photocathode in photoemission mode.

7. The high-brightness electron beam source of claim 1, wherein the photocathode comprises:
a CsBr photocathode.

8. The high-brightness electron beam source of claim 7, wherein the two or more wavelength bands comprise:
the first wavelength band associated with photon energies in a range of approximately 4.6 eV to approximately 7.2 eV; and
the second wavelength band associated with photon energies greater than approximately 2.4 eV.

9. The high-brightness electron beam source of claim 1, wherein the broadband illumination source comprises:
a continuous-wave illumination source, wherein the one or more electron beams emitted in response to the filtered illumination comprise one or more continuous electron beams.

10. The high-brightness electron beam source of claim 1, wherein the broadband illumination source comprises:
a pulsed illumination source, wherein the one or more electron beams emitted in response to the filtered illumination comprise one or more pulsed electron beams.

11. The high-brightness electron beam source of claim 1, wherein the broadband illumination source comprises:
at least one of a laser-produced plasma source or a laser-sustained plasma source.

12. The high-brightness electron beam source of claim 1, wherein the broadband illumination source comprises:
at least one of a supercontinuum laser and a white-light laser.

13. The high-brightness electron beam source of claim 1, wherein the broadband illumination source comprises:
at least one of an optical parametric oscillator and an optical parametric amplifier.

14. The high-brightness electron beam source of claim 1, wherein the one or more electron beams comprise:
a single electron beam.

15. The high-brightness electron beam source of claim 14, wherein the photocathode comprises:
at least one of a planar photocathode and a photocathode including a single emission tip.

16. The high-brightness electron beam source of claim 1, wherein the one or more electron beams comprise:
two or more electron beams.

17. The high-brightness electron beam source of claim 16, wherein the photocathode comprises:
at least one of a photocathode including two or more emission tips and a patterned photocathode providing two or more emission structures.

18. An inspection system comprising:
a high-brightness electron beam source comprising:
a broadband illumination source configured to generate broadband illumination;
a tunable spectral filter configured to filter the broadband illumination to provide filtered illumination having an excitation spectrum; and
a photocathode configured to emit one or more electron beams in response to the filtered illumination, wherein emission from the photocathode is adjustable based on the excitation spectrum of the filtered illumination from the tunable spectral filter, wherein the tunable spectral filter is configured to generate the excitation spectrum including a first wavelength band configured to pump electrons in the photocathode to at least one intraband energy state, and a second wavelength band different from the first wavelength band, the second wavelength band configured to pump the electrons from the at least one intraband energy state to a vacuum state; and
one or more electron focusing elements configured to direct the one or more electron beams from the high-brightness electron beam source to a sample; and
one or more detectors to detect radiation from the sample generated in response to the one or more electron beams.

19. The inspection system of claim 18, wherein the one or more detectors comprise:
one or more electron detectors to detect at least one of secondary electrons or backscattered electrons emitted by the sample.

20. The inspection system of claim 18, wherein the one or more detectors comprise:
at least one photodetector to detect photons emitted by the sample.

21. The inspection system of claim 18, wherein the photocathode comprises:
an alkali halide photocathode.

22. The inspection system of claim 18, wherein the tunable spectral filter is configured to provide the excitation spectrum selected to provide a selected balance between quantum efficiency of the photocathode and an energy spread of the one or more electron beams.

23. The inspection system of claim 18, wherein the tunable spectral filter is configured to provide the excitation spectrum selected to provide emission from the photocathode in photoelectric mode.

24. The inspection system of claim 18, wherein the tunable spectral filter is configured to provide the excitation spectrum selected to provide emission from the photocathode in photoemission mode.

25. The inspection system of claim 18, wherein the broadband illumination source comprises:
a continuous-wave illumination source, wherein the one or more electron beams emitted in response to the filtered illumination comprise one or more continuous electron beams.

26. The inspection system of claim 18, wherein the broadband illumination source comprises:
a pulsed illumination source, wherein the one or more electron beams emitted in response to the filtered illumination comprise one or more pulsed electron beams.

27. The inspection system of claim 18, wherein the broadband illumination source comprises:
at least one of a laser-produced plasma source, a laser-sustained plasma source, a supercontinuum laser, a white-light laser, an optical parametric oscillator, and an optical parametric amplifier.

28. The inspection system of claim 18, wherein the one or more electron beams comprise:
a single electron beam, wherein, the photocathode comprises:
at least one of a planar photocathode and a photocathode including a single emission tip.

29. The inspection system of claim 18, wherein the one or more electron beams comprise:
two or more electron beams, wherein the photocathode comprises:
at least one of a photocathode including two or more emission tips and a patterned photocathode providing two or more emission structures.

30. A method for generating high-brightness electron beams comprising:
generating broadband illumination with a broadband illumination source;
filtering, with a tunable spectral filter, the broadband illumination to provide filtered illumination having an excitation spectrum including a first wavelength band and at least a second wavelength band different from the first wavelength band; and
emitting, with a photocathode, one or more electron beams in response to the filtered illumination, wherein emission from the photocathode is adjustable based on the excitation spectrum of the filtered illumination from the tunable spectral filter, the first wavelength band is configured to pump electrons in the photocathode to at least one intraband energy state, and the second wavelength band is configured to pump the electrons from the at least one intraband energy state to a vacuum state.

31. A high-brightness electron beam source comprising:
a broadband illumination source configured to generate broadband illumination;
a tunable spectral filter configured to filter the broadband illumination to provide filtered illumination having an excitation spectrum; and
a photocathode configured to emit one or more electron beams in response to the filtered illumination, wherein emission from the photocathode is adjustable based on the excitation spectrum of the filtered illumination from the tunable spectral filter,
wherein the tunable spectral filter is configured to provide the excitation spectrum selected to pump electrons in the photocathode to at least one of a resonant electronic band or a trap, wherein the photocathode includes a voltage source to generate an electric field to facilitate tunneling of the pumped electrons to generate the one or more electron beams.

32. An inspection system comprising:
a high-brightness electron beam source comprising:
a broadband illumination source configured to generate broadband illumination;
a tunable spectral filter configured to filter the broadband illumination to provide filtered illumination having an excitation spectrum; and
a photocathode configured to emit one or more electron beams in response to the filtered illumination, wherein emission from the photocathode is adjustable based on the excitation spectrum of the filtered illumination from the tunable spectral filter, wherein the tunable spectral filter is configured to provide the excitation spectrum selected to pump electrons in the photocathode to at least one of a resonant electronic band or a trap, wherein the photocathode includes a voltage source to generate an electric field to facilitate tunneling of the pumped electrons to generate the one or more electron beams; and
one or more electron focusing elements configured to direct the one or more electron beams from the high-brightness electron beam source to a sample; and
one or more detectors to detect radiation from the sample generated in response to the one or more electron beams.

33. A method for generating high-brightness electron beams comprising:
generating broadband illumination with a broadband illumination source;
filtering, with a tunable spectral filter, the broadband illumination to provide filtered illumination having an excitation spectrum; and
emitting, with a photocathode, one or more electron beams in response to the filtered illumination, wherein emission from the photocathode is adjustable based on the excitation spectrum of the filtered illumination from the tunable spectral filter, wherein the tunable spectral filter is configured to provide the excitation spectrum selected to pump electrons in the photocathode to at least one of a resonant electronic band or a trap, wherein the photocathode includes a voltage source to generate an electric field to facilitate tunneling of the pumped electrons to generate the one or more electron beams.

* * * * *